(12) United States Patent
Okazaki

(10) Patent No.: US 6,869,813 B2
(45) Date of Patent: Mar. 22, 2005

(54) CHIP-TYPE LED AND PROCESS OF MANUFACTURING THE SAME

(75) Inventor: Jun Okazaki, Nara (JP)

(73) Assignee: Sharp Kabushiki Kaisha, Osaka ( * ) Notice: Subject to any disclaimer, the term of this patent is extended or adjusted under 35 U.S.C. 154(b) by 0 days.

(21) Appl. No.: 10/648,620

(22) Filed: Aug. 25, 2003

(65) Prior Publication Data

US 2004/0036081 A1 Feb. 26, 2004

Related U.S. Application Data

(62) Division of application No. 10/025,013, filed on Dec. 18, 2001, now Pat. No. 6,653,661.

(30) Foreign Application Priority Data

Dec. 19, 2000 (JP) ........................................ 2000-385267

(51) Int. Cl.[7] ............................................... H01L 21/00
(52) U.S. Cl. ............................. 438/22; 438/25; 438/26; 438/29; 438/30; 438/35; 438/42; 438/43; 438/46; 438/47; 257/99; 257/676; 29/825; 29/827
(58) Field of Search ............................. 438/22, 25–47; 257/99, 676; 29/825, 827

(56) References Cited

U.S. PATENT DOCUMENTS

| 4,209,358 | A | * | 6/1980 | DiLeo et al. | 156/293 |
|---|---|---|---|---|---|
| 5,514,627 | A | * | 5/1996 | Lowery et al. | 438/26 |
| 5,851,847 | A | * | 12/1998 | Yamanaka | 438/26 |
| 5,882,949 | A | * | 3/1999 | Okazaki | 438/26 |
| 6,060,729 | A | * | 5/2000 | Suzuki et al. | 257/99 |
| 6,169,295 | B1 | * | 1/2001 | Koo | 257/81 |
| 6,482,664 | B1 | * | 11/2002 | Lee et al. | 438/28 |
| 6,518,600 | B1 | * | 2/2003 | Shaddock | 257/98 |
| 6,774,405 | B2 | * | 8/2004 | Yasukawa et al. | 257/99 |

FOREIGN PATENT DOCUMENTS

| JP | 57-085273 | 5/1982 |
|---|---|---|
| JP | 05-226698 | 9/1993 |
| JP | 07-176791 | 7/1995 |
| JP | 09-007409 | 1/1997 |
| JP | 3-048368 | 2/1998 |
| JP | 10-261821 | 9/1998 |
| JP | 11-087778 | 3/1999 |
| JP | 11-087780 | 3/1999 |
| JP | 2000-031548 | 1/2000 |
| JP | 2000-156528 | 6/2000 |
| JP | 2000-223748 | 8/2000 |

* cited by examiner

Primary Examiner—Matthew Smith
Assistant Examiner—Granvill D. Lee, Jr.
(74) Attorney, Agent, or Firm—Morrison & Foerster LLP

(57) ABSTRACT

A chip-type LED including a LED element and a tubular vessel accommodating the LED element therein, wherein the vessel has an upper opening and a lower opening, the LED element is positioned between the upper opening and the lower opening such that the LED element emits light toward the upper opening, and the vessel is filled with a light-transmissive resin from the upper opening to the lower opening.

6 Claims, 13 Drawing Sheets

(a)

(b)

(a)

(b)

CHIP-TYPE LED AND PROCESS OF MANUFACTURING THE SAME

CROSS-REFERENCE TO RELATED APPLICATION

The present application is a divisional of U.S. patent application Ser. No. 10/025,013, filed Dec. 18, 2001) now U.S. Pat. No. 6,653,661, which claims priority under 35 U.S.C. §119 to Japanese Patent application No. 2000-385267 filed on Dec. 19, 2000, the disclosure of which is incorporated by reference in its entirety.

BACKGROUND OF THE INVENTION

1. Field of the Invention

The present invention relates to a chip-type LED and a process of manufacturing the same, and more particularly, it relates to a chip-type LED utilized as a light source for various display panels or a backlight source for liquid crystal display devices.

2. Description of Related Art

There has been known a common chip-type LED comprising a pair of lead frames each extending to the bottom of a concave portion of a molded article, a LED element mounted on one of the lead frames and a light-transmissive resin filled in the concave portion. Some of the chip-type LEDs utilize an LED element which emits blue or bluish-purple light and a light-transmissive resin containing a fluorescent material.

The chip-type LED of this kind converts a part of the blue or bluish-purple light to yellow light and mixes the yellow light and the blue or bluish-purple light to emit white light (see Publication of Japanese Patent No. 2927279).

The molded article used in the above-mentioned chip-type LED is formed by insert molding, i.e., by injecting a resin into a mold supporting the pair of lead frames therein. In general, a modified polyimide resin is used as the resin.

The light-transmissive resin may generally be a light-transmissive epoxy resin which is resistant to heat generated by soldering.

In the common chip-type LED, the light-transmissive resin may be expanded when heat is externally applied by soldering or the like. This may cause a thermal stress to a junction between the molded article and the light-transmissive resin, the LED element itself and a gold wire connecting the LED element and the lead frames. In such a case, the light-transmissive resin may come off the molded article or the gold wire may be cut off.

As the cause of the above inconvenience, considered is a difference between expansion coefficient of the epoxy resin used as the light-transmissive resin for filling the concave portion and that of the modified polyimide resin used as a material for the molded article.

In general, the expansion coefficient of the epoxy resin is $5-8\times10^{-5}/°$ C., while that of the modified polyimide resin is $2-6\times10^{-5}/°$ C.

Where an epoxy resin containing a fluorescent material is used to fill the concave portion in order to emit white light, the fluorescent material precipitates at the bottom of the concave portion as time goes by even if it is sufficiently mixed with the epoxy resin in a liquid state. Such a problem is caused by the specific gravity of the inorganic fluorescent material that is greater than that of the organic epoxy resin.

When the fluorescent material precipitates at the bottom of the concave portion, a concentration of the fluorescent material becomes lower than a predetermined value at the upper portion of the concave portion, whereas it becomes higher at the bottom portion.

In such a case, there is caused a difference in distance across the fluorescent material covered by light emitted from the upper surface of the LED element and that covered by light emitted from the side surface thereof. Accordingly, a degree of conversion from the blue light or bluish-purple light to the yellow light is also varied. As a result, when the opening of the concave portion is viewed from the top, a portion of strong blue light and a portion of strong yellow light are observed, thereby generating unevenness in color.

Even if the fluorescent material concentration in the light-transmissive resin is uniform, it is still difficult to completely avoid the unevenness in color because there is a difference in distance across the fluorescent material covered by light emitted from the upper surface of the LED element and that covered by light emitted from the side surface thereof.

Further, when the LED element which emits ultraviolet light such as bluish-purple light is utilized, luminance is lowered and the resulting LED would not be suitable for practical use because the light-transmissive resin such as the epoxy resin is decomposed by the ultraviolet light and turned yellow or black.

SUMMARY OF THE INVENTION

Under the above-mentioned circumstances, the present invention have been achieved to provide a chip-type LED which is resistant to an externally applied thermal stress, hardly causes unevenness in color even in the case of emitting white light and scarcely decomposes a light-transmissive resin even if it is used in combination with an LED element emitting the ultraviolet light, and a process of manufacturing the same.

According to the present invention, there is provided a chip-type LED comprising a LED element and a tubular vessel accommodating the LED element therein, wherein the vessel has an upper opening and a lower opening, the LED element is positioned between the upper opening and the lower opening such that the LED element emits light toward the upper opening, and the vessel is filled with a light-transmissive resin from the upper opening to the lower opening.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
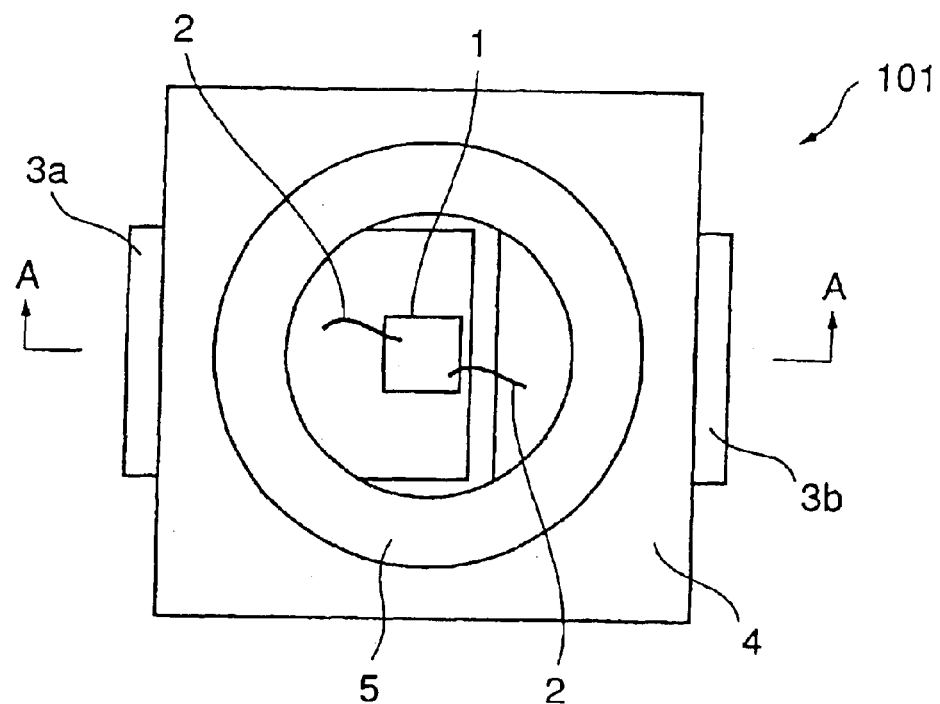
FIG. 1 is a plan view of a chip-type LED according to Embodiment 1 of the present invention.

The LED element according to the present invention may be, for example, an infrared light emitting element made of gallium arsenide, a red light emitting element made of aluminum gallium arsenide, an orange or yellow light emitting element made of gallium arsenide phosphide, a yellowish-green light emitting element made of gallium phosphide doped with nitrogen, or a blue or bluish-purple light emitting element made of a gallium nitride compound.

Where the LED element which emits the bluish-purple light is used as will be mentioned later, it is preferred to change a wavelength of the bluish-purple light via the fluorescent layer before the light enters the light-transmissive resin so that the light-transmissive resin is prevented from being decomposed by the bluish-purple light.

The tubular vessel according to the present invention may be formed of a heat-resistant plastic such as a polyimide resin, a modified polyimide resin, polyether ether ketone containing a reinforcing material, polyphenylene sulfide containing a reinforcing agent or the like.

The light-transmissive resin according to the present invention may be a weather resistant transparent resin such as an epoxy resin, a silicon resin, a polyimide resin or the like.

In the present invention, a chip-type LED may further comprise a first lead frame and a second lead frame inserted into the vessel. In such a case, it is preferred that the first lead frame supports the LED element, and the first and second lead frames are electrically connected to the LED element.

The first and second lead frames according to the present invention may be formed of a flat plate made of iron, copper, copper containing iron, copper containing tin, copper-plated aluminum, copper-plated iron, copper-plated copper, gold-plated aluminum, gold-plated iron, gold-plated copper, silver-plated aluminum, silver-plated iron, silver-plated copper or the like.

According to the present invention, the electrical connection between the LED element and the first and second lead frames may be established by, for example, bonding conductive wires between the electrodes of the LED element and the lead frames, respectively.

The conductive wires may be made of metal such as gold, copper, platinum, aluminum or the like.

In the chip-type LED according to the present invention, the LED element may emit blue light. In such a case, it is preferred that the vessel includes a fluorescent layer for converting the blue light to yellow light in the neighborhood of the upper opening of the vessel.

The fluorescent layer mentioned herein signifies a layer formed by curing a light-transmissive resin containing a fluorescent material.

The fluorescent material may be made of yttrium, aluminum and garnet, for example.

Other than the above fluorescent material, may also be used a fluorescent material comprising: a base selected from the group consisting of inorganic fluorescent materials such as an oxide, a sulfide, a silicate and a vanadate of rare earth element such as zinc, cadmium, magnesium, silicon and yttrium, and organic fluorescent materials such as fluorescein, eosin, oils (mineral oils) and the like; an activator selected from the group consisting of silver, copper, manganese, chromium, europium, zinc, aluminum, lead, phosphorus, arsenic and gold; and a fusing agent selected from the group consisting of sodium chloride, potassium chloride, magnesium carbonate and barium chloride.

In the chip-type LED according to the present invention, the vessel may have a cylindrical inner wall extending from the upper opening to the lower opening. In such a case, it is preferred that the vessel has an inner diameter which is minimized at an intermediate position between the upper and lower openings and increases gradually from the intermediate position towards the upper opening and the lower opening.

According to such a construction, light emitted from the LED element is efficiently reflected on the inner wall surface toward the upper opening.

Further, the thus constructed inner wall surface serves as a stopper for the light-transmissive resin to be filled in the vessel in both directions towards the upper and lower openings, so that the light-transmissive resin will not be slipped out of the vessel even if it is applied with external heat and expanded.

Since the amount of the light-transmissive resin filled in the intermediate position having the small inner diameter is reduced, a thermal stress caused to the intermediate position carrying the small amount of the resin is relatively smaller than that caused to other portions even if external heat is applied to the light-transmissive resin. Therefore, by arranging the ends of the first and second lead frames, the LED element and the conductive wires at the intermediate portion between the upper and lower openings of the vessel, damage to these components caused by the thermal stress is effectively avoided.

According to the chip-type LED of the present invention, the light-transmissive resin may be protruded from the upper opening to form a convex lens portion.

According to the chip-type LED of the present invention, the vessel may have a Fresnel lens or an inner lens in the neighborhood of the upper opening.

According to the chip-type LED of the present invention, the fluorescent layer may be a molded plate made of a light-transmissive resin containing a fluorescent material.

According to the chip-type LED of the present invention, a concentration of the fluorescent material in the molded plate may be varied within the molded plate.

Specifically, the fluorescent material concentration is varied such that the wavelengths of lights emitted out of the chip-type LED are varied by about 10 nm or more depending on the sites from which they are emitted. With such a construction, light emission of different colors is achieved by a single LED.

The same effect as described above is also obtained by forming the fluorescent layer with a plurality of molded plates made of a light-transmissive resin containing a fluorescent material to have different fluorescent material concentrations.

The present invention also provides a chip-type LED comprising a LED element for emitting bluish-purple light, a pot-shaped cup for accommodating the LED element therein, a tubular vessel having an upper opening and a lower opening and accommodating the the cup therein, a light-transmissive member for sealing the upper opening of the vessel, a fluorescent layer for converting the bluish-purple light to yellow light, and a first lead frame and a second lead frame inserted into the vessel, wherein the first and second lead frames are electrically connected to the LED element, the cup is placed on the first lead frame such that the light emitted from the LED element is reflected in the cup towards the upper opening, the fluorescent layer is positioned between the LED element and the light-transmissive member.

According to such a construction, the LED element is surrounded by a hollow space. The bluish-purple light emitted from the LED element surely passes through the fluorescent layer and then enters the light-transmissive member, thereby the light-transmissive member is prevented from turning yellow or black.

The lower opening of the vessel may be left opened according to the application. Alternatively, it may be sealed with a tape or a resin plate to protect the LED element after the hollow space around the LED element is filled with nitrogen or the like.

The present invention also provides a chip-type LED comprising a plate-shaped insulating substrate having a bore penetrating from a front surface to a rear surface thereof, the bore having a front opening and a rear opening, a pair of first and second wiring traces formed on the rear surface and partially extended into the rear opening, a LED element mounted on the first wiring trace in the bore and electrically connected with the first and second wiring traces, an insulating film formed on the rear surface to cover the first and second wiring traces and the rear opening, and a light-transmissive member formed in the bore to cover the LED element, wherein the insulating film has a hole leading into the bore for adding dropwise a material of the light-transmissive member into the bore through the hole.

In this chip-type LED, the insulating substrate provided with three-dimensional wiring traces is used in place of the vessel and the lead frames, thereby reducing the thickness of the chip-type LED.

If the reduction of the thickness is not required very much, the insulating film may be replaced with an insulating substrate to form a chip-type LED of dual substrate structure.

In the above-mentioned chip-type LED utilizing the insulating substrate, plural pairs of the first and second wiring traces may be formed and the LED elements may be mounted on the first wiring traces and electrically connected with the first and second wiring traces, respectively.

In the above-mentioned chip-type LED utilizing the insulating substrate, the LED element may emit bluish-purple light. In such a case, it is preferred that the light-transmissive member is a fluorescent layer for converting the bluish-purple light to yellow light and the bore has on its inner wall surface a reflective layer for reflecting the emitted light towards the fluorescent layer.

Where the LED element which emits the blue or bluish-purple light is used in the chip-type LED of the invention, a zener diode may further be provided in the neighborhood of the LED element mounted on the first lead frame in the vessel. Alternatively, the zener diode may be provided onto the second lead frame in the vessel. Since the LED element of gallium nitride or the like which emits the blue or bluish-purple light shows an electrostatic breakdown voltage as small as 100V or less, it is preferred that the zener diode is provided for the purpose of protecting the LED element from external noises such as the surge.

The chip-type LED according to the present invention, which comprises a LED element and a tubular vessel accommodating the LED element therein, wherein the vessel has an upper opening and a lower opening, the LED element is positioned between the upper opening and the lower opening such that the LED element emits light toward the upper opening, and the vessel is filled with a light-transmissive resin from the upper opening to the lower opening, may be manufactured by a process comprising the steps of: accommodating a LED element in a tubular vessel; closely adhering the vessel to an adhesive tape to seal an upper opening of the vessel with the adhesive tape; adding dropwise a light-transmissive resin through a lower opening of the vessel; and peeling off the adhesive tape from the vessel.

According to the process, the light-transmissive resin is surely filled to the same level as the upper opening, thereby a problem of insufficient filling of the light-transmissive resin is cleared.

Where the chip-type LED further comprises a first lead frame and a second lead frame inserted into the vessel, the first lead frame supports the LED element, the first and second lead frames are electrically connected to the LED element, the LED element emits blue light, and the vessel includes the fluorescent layer for converting the blue light to yellow light in the neighborhood of the upper opening, the chip-type LED may be manufactured by a process comprising the steps of: inserting a first lead frame and a second lead frame into a tubular vessel; mounting a LED element on the first lead frame to electrically connect the LED element to the first and second lead frames; closely adhering the vessel to an adhesive tape to seal an upper opening of the vessel with the adhesive tape; adding dropwise a light-transmissive resin containing a fluorescent material through a lower opening of the vessel to form a fluorescent layer in a neighborhood of the upper opening, adding dropwise a light-transmissive resin through the lower opening of the vessel; and peeling off the adhesive tape from the vessel.

The light-transmissive resin may be added dropwise up to the level of the lower opening after or before the light-transmissive resin containing the fluorescent material is cured. Since the fluorescent material is an inorganic material and has a great specific gravity, it is hardly mixed with the secondly added light-transmissive resin even before the curing thereof.

Alternatively, the light-transmissive resin containing the fluorescent material may be filled to the level of the lower opening at a time and then let the fluorescent material precipitate spontaneously in the neighborhood of the upper opening to form the fluorescent layer.

According to the above-described processes, the fluorescent layer of a uniform thickness is formed only in the neighborhood of the upper opening, thereby the light beams emitted from the LED element pass through almost the same distance in the fluorescent layer. Thus, unevenness in color of light emitted from the LED is eliminated.

Further, the chip-type LED including the light-transmissive resin protruded from the upper opening to form the convex lens portion may be manufactured by a process comprising the steps of: closely adhering the vessel integrated with the first and second lead frames and the LED element to a mold having a concave portion corresponding to the shape of the convex lens portion such that the upper opening of the vessel is closed by the concave portion; and adding dropwise the light-transmissive resin from the lower opening of the vessel.

According to the process, the chip-type LED having the convex lens at the upper opening is easily manufactured.

Lenses of various forms such as a dome-shaped lens and an inner lens may be formed by using molds of different shapes.

The chip-type LED having a Fresnel lens or an inner lens formed in the neighborhood of the upper opening may be manufactured by a process comprising the steps of: adhering a Fresnel lens or an inner lens prepared in advance to an adhesive tape; adhering the vessel integrated with the first and second lead frames and the LED element to the adhesive tape such that the upper opening of the vessel is closed by the Fresnel lens or the inner lens; and adding dropwise the light-transmissive resin from the lower opening of the vessel.

The chip-type LED having the fluorescent layer in the neighborhood of the upper opening of the vessel, wherein the florescent layer is a molded plate previously formed of a light-transmissive resin containing a fluorescent material may be manufactured by a process comprising the steps of: adhering the molded plate previously formed of the light-transmissive resin containing the fluorescent material to an adhesive tape; adhering the vessel integrated with the first and second lead frames and the LED element to the adhesive tape such that the upper opening of the vessel is closed by the molded plate; and adding dropwise the light-transmissive resin from the lower opening of the vessel.

According to the process, the light-transmissive resin is added at a time, which simplifies the manufacturing steps.

The manufacturing process can also be applied to the cases of providing, in the neighborhood of the upper opening of the vessel, a molded plate in which the fluorescent material concentration is varied or a plurality of molded plates having the fluorescent material concentrations different from each other.

The chip-type LED according to the present invention, which comprises a LED element for emitting bluish-purple light, a pot-shaped cup for accommodating the LED element therein, a tubular vessel having an upper opening and a lower opening and accommodating the the cup therein, a light-transmissive member for sealing the upper opening of the vessel, a fluorescent layer for converting the bluish-purple light to yellow light, and a first lead frame and a second lead frame inserted across the vessel, wherein the first and second lead frames are electrically connected to the LED element, the cup is placed on the first lead frame such that the light emitted from the LED element is reflected in the cup towards the upper opening, the fluorescent layer is positioned between the LED element and the light-transmissive member, may be manufactured by a process comprising the steps of: inserting a first lead frame and a second lead frame into a tubular vessel; placing a pot-shaped cup on the first lead frame, accommodating a LED element for emitting bluish-purple light in the cup to electrically connect the LED element to the first and second lead frames; closely adhering the vessel to an adhesive tape to seal an upper opening of the vessel with the adhesive tape; adding dropwise a light-transmissive resin containing a fluorescent material through a lower opening of the vessel to form the fluorescent layer in a neighborhood of the upper opening; and peeling off the adhesive tape from the vessel.

Also according to the processes, the fluorescent layer of a uniform thickness is formed only in the neighborhood of the upper opening, thereby the light beams emitted from the LED element pass through almost the same distance in the fluorescent layer. Thus, unevenness in color of light emitted from the LED is eliminated.

The chip-type LED according to the present invention, which comprises a plate-shaped insulating substrate having a bore penetrating from a front surface to a rear surface thereof, the bore having a front opening and a rear opening, a pair of first and second wiring traces formed on the rear surface and partially extended into the rear opening, a LED element mounted on the first wiring trace in the bore and electrically connected with the first and second wiring traces, an insulating film formed on the rear surface to cover the first and second wiring traces and the rear opening, and a light-transmissive member formed in the bore to cover the LED element, wherein the insulating film has a hole leading into the bore for adding dropwise a material of the light-transmissive member into the bore through the hole, may be manufactured by a process comprising the steps of: forming a first wiring trace and a second wiring trace on a rear surface of an insulating substrate having a bore penetrating from a front surface to the rear surface so that the first and second wiring traces are partially extend into a rear opening of the bore; mounting a LED element on the first wiring trace to electrically connect the LED element to the first and second wiring traces; forming an insulating film having a hole leading into the bore to cover the first and second wiring traces and the rear opening; closely adhering the insulating substrate to an adhesive tape to seal a front opening of the bore with the adhesive tape; adding dropwise a light-transmissive resin through the hole of the insulating film to form a light-transmissive member covering the LED element; and peeling off the adhesive tape from the insulating substrate.

Where the chip-type LED includes a LED element which emits bluish-purple light, a fluorescent layer for converting the bluish-purple light to yellow light as the light-transmissive member and a bore having on its inner surface a reflective layer for reflecting the light emitted from the LED element towards the fluorescent layer, the chip-type LED may be manufactured by a process comprising the steps of: adhering the front surface of the insulating substrate integrated with the first and second wiring traces, the LED element and the reflective layer to the adhesive tape; and adding dropwise a predetermined amount of the light-transmissive resin containing a fluorescent material from the hole of the insulating film.

Also according to the processes, the fluorescent layer of a uniform thickness is formed only in the neighborhood of the upper opening, thereby the light beams emitted from the LED element pass through almost the same distance in the fluorescent layer. Thus, unevenness in color of light emitted from the LED is eliminated.

Also in the chip-type LED utilizing the insulating substrate, the lens or the previously formed fluorescent layer can be formed in the neighborhood of the upper opening by applying the manufacturing process of the chip-type LED utilizing the tubular vessel is applied.

EMBODIMENTS

Hereinafter, the present invention is detailed by way of embodiments illustrated in the figures. However, the present invention is not limited thereto.

Embodiment 1

A chip-type LED according to Embodiment 1 of the present invention is explained with reference to FIGS. 1 to 4. FIG. 1 is a plan view of the chip-type LED according to Embodiment 1 of the present invention, FIG. 2 is a front view of the same, FIG. 3 is a section taken along the line A—A shown in FIG. 1, and FIGS. 4(a) and 4(b) are views illustrating the steps of manufacturing the chip-type LED according to Embodiment 1.

Figure 2:
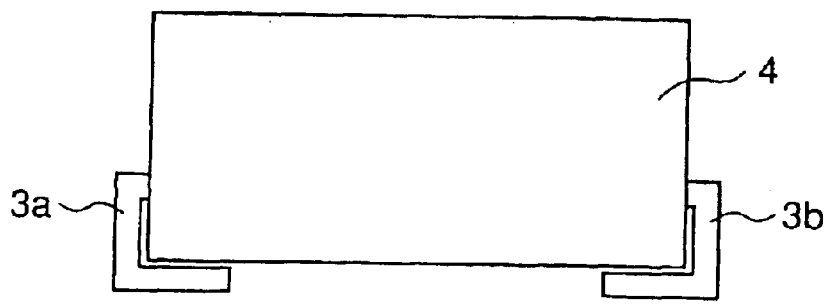
FIG. 2 is a front view of the chip-type LED shown in FIG. 1.
Figure 3:
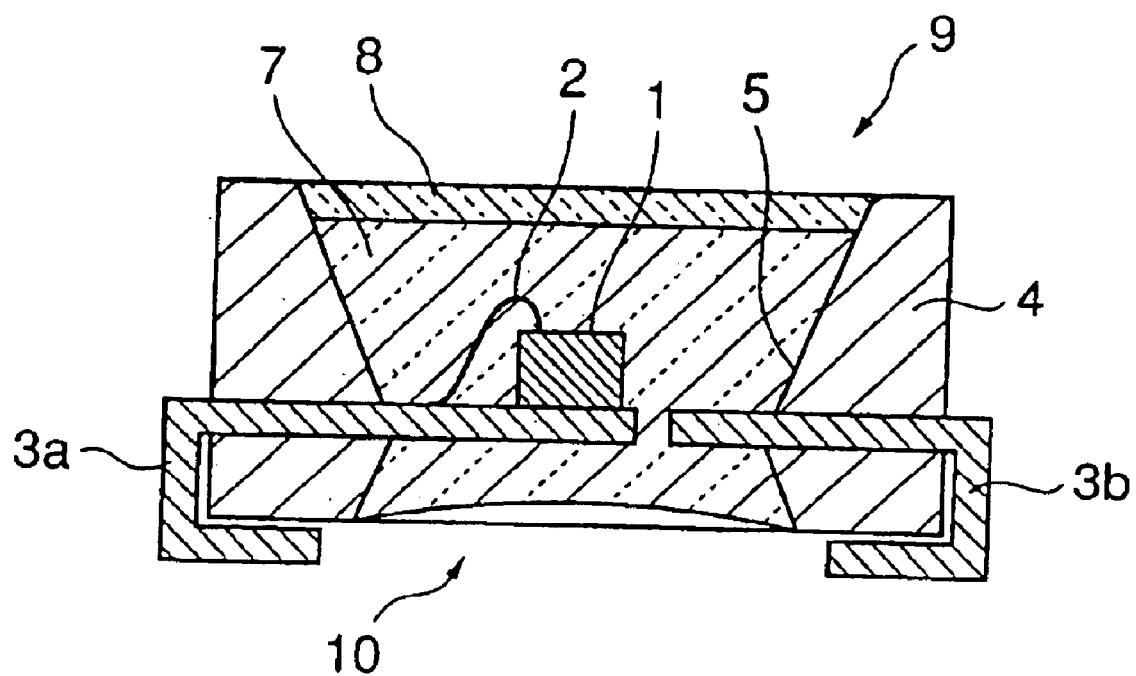
FIG. 3 is a section of the chip-type LED shown in FIG. 1 taken along the line A—A.
Figure 4:
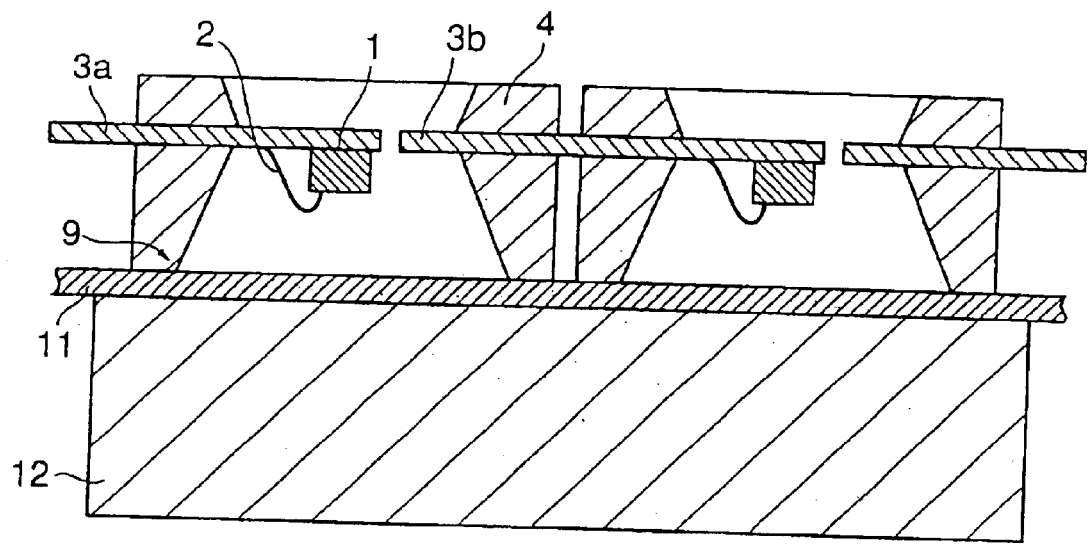
FIGS. 4(a) and 4(b) are views illustrating the steps of manufacturing the chip-type LED according to Embodiment 1 of the present invention.
Figure 4:
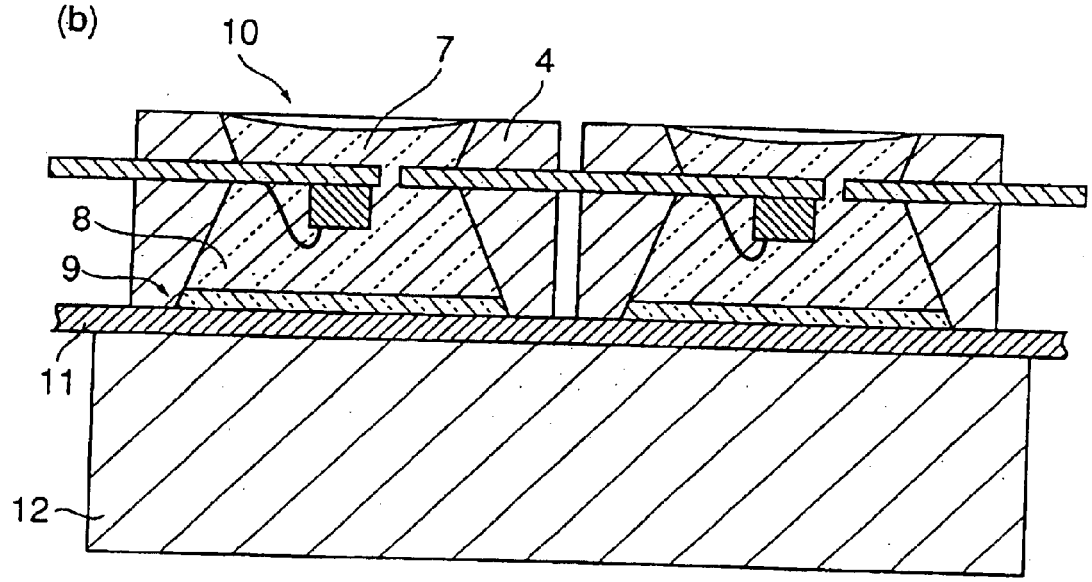

As shown in FIGS. 1 to 3, the chip-type LED 101 according to Embodiment 1 of the present invention comprises a LED element 1 and tubular vessel 4 accommodating the LED element 1 therein. The vessel 4 has an upper opening 9 and a lower opening 10, the LED element 1 is positioned between the upper opening 9 and the lower opening 10 such that the LED element 1 emits light toward the upper opening 9, and the vessel 4 is filled with a light-transmissive resin 7 from the upper opening 9 to the lower opening 10. The chip type LED 101 further comprises a first lead frame 3a and second lead frame 3b inserted into the vessel 4. The first lead frame 3a supports the LED element 1, and first lead frame 3a and second lead frame 3b are electrically connected to the LED element 1.

In detail, as shown in FIGS. 1 to 3, the tubular vessel 4 is made of a modified polyimide resin and formed by insert molding such that it supports the first and second lead frames 3a and 3b made of silver-plated copper.

The ends of the first and second lead frames 3a and 3b are protruded from an inner wall surface 5 into the inside of the vessel 4 and the LED element 1 which emits blue light is mounted on the protruded portion of the first lead frame 3a.

The LED element 1 and the first and second lead frames 3a and 3b are electrically connected by bonding them via a gold wire 2.

In the neighborhood of the upper opening 9 of the vessel 4, a fluorescent layer 8 for converting blue light to yellow light is formed. A space in the vessel 4 between the fluorescent layer 8 and the lower opening 10 is filled with a transparent epoxy resin used as the light-transmissive resin 7. The step of forming the fluorescent layer 8 and the step of filling the light-transmissive resin 7 are explained with reference to FIGS. 4(a) and 4(b).

As shown in FIG. 4(a), the vessel 4 which has been integrated with the first and second lead frames 3a and 3b, the LED element 1 and the gold wire 2 is closely adhered to an adhesive glass cloth tape 11 such that the upper opening 9 of the vessel 4 is sealed with the glass cloth tape 11. The glass cloth tape 11 is placed on a fixing jig 12.

Then, as shown in FIG. 4(b), a predetermined amount of a light-transmissive resin containing a fluorescent material is added dropwise into the vessel 4 through the lower opening 10. After the light-transmissive resin containing the fluorescent material is cured spontaneously to form the fluorescent layer 8, the light-transmissive resin 7 is added through the lower opening 10 to fill the vessel 4 completely.

After the thus added light-transmissive resin 7 is cured spontaneously, the glass cloth tape 11 is peeled off the vessel 4, thereby the chip-type LED 101 shown in FIGS. 1 to 3 is completed.

According to the steps, the fluorescent layer 8 having a uniform thickness is formed only in the neighborhood of the upper opening 9 of the vessel 4.

Though it is not shown in the figures, it is possible to adhere a molded plate formed in advance of a light-transmissive resin containing a fluorescent material to the glass cloth tape 11 and closely adhere the vessel 4 to the glass cloth tape 11 such that the upper opening 9 of the vessel 4 is covered with the molded plate, and then fill the light-transmissive resin 7 into the vessel.

The concentration of the fluorescent material in the molded plate may be varied within the molded plate, or alternatively, a plurality of molded plates having different fluorescent material concentrations may be combined.

Where a lens (see FIG. 5) or the fluorescent layer 8 is not required, the light-transmissive resin 7 may be injected from either of the upper and lower openings 9 and 10.

Embodiment 2

Figure 5:
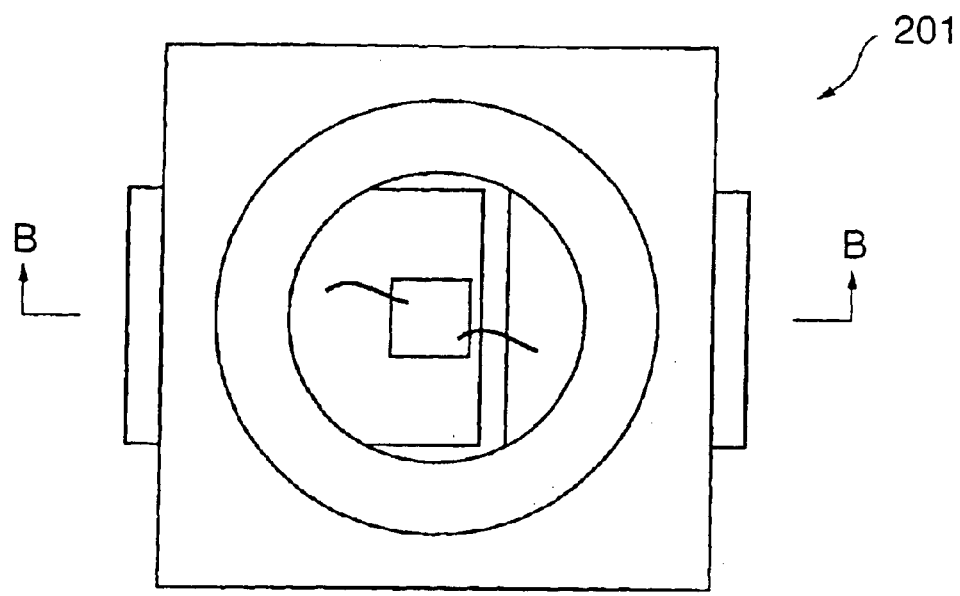
FIG. 5 is a plan view of a chip-type LED according to Embodiment 2 of the present invention.
Figure 6:
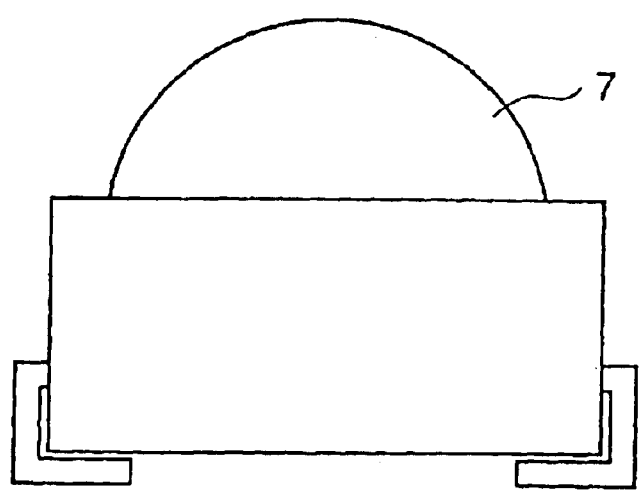
FIG. 6 is a front view of the chip-type LED shown in FIG. 5.
Figure 7:
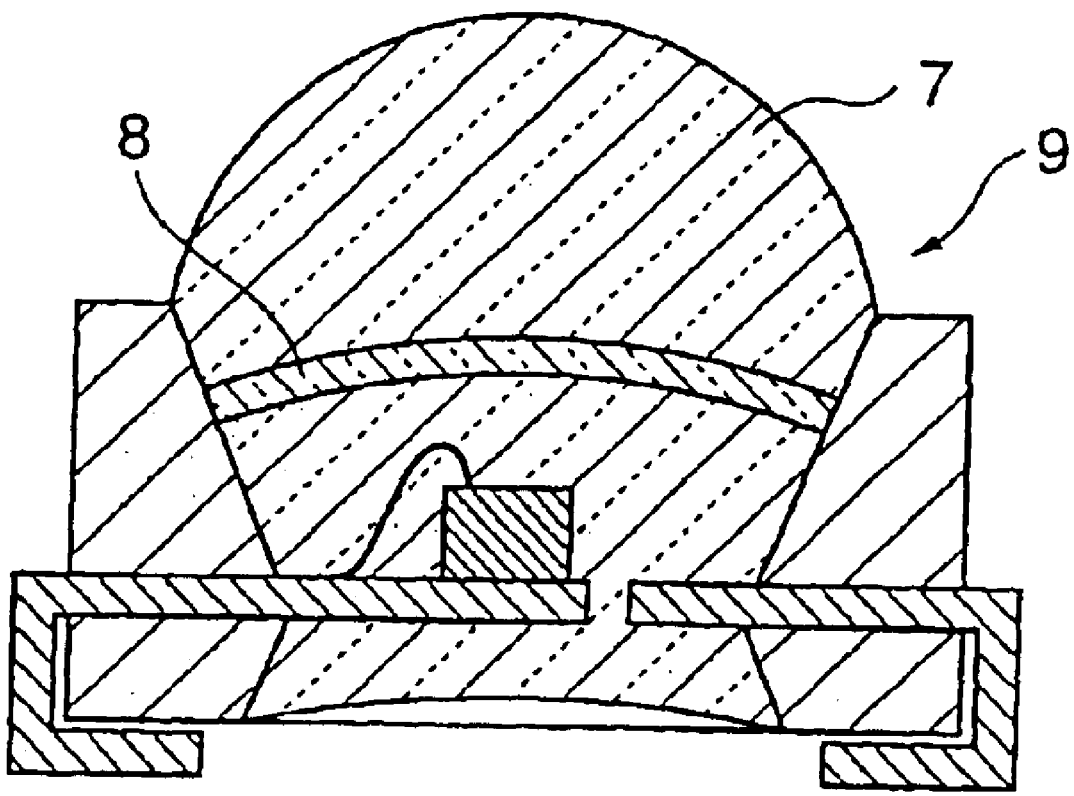
FIG. 7 is a section of the chip-type LED shown in FIG. 5 taken along the line B—B.
Figure 8:
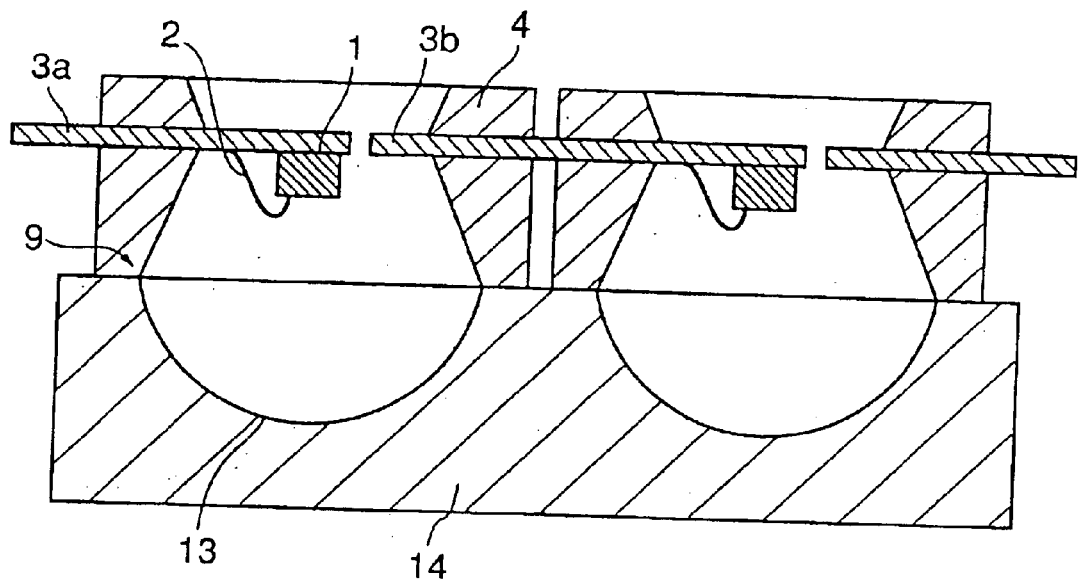
FIGS. 8(a) and 8(b) are views illustrating the steps of manufacturing the chip-type LED according to Embodiment 2 of the present invention.
Figure 8:
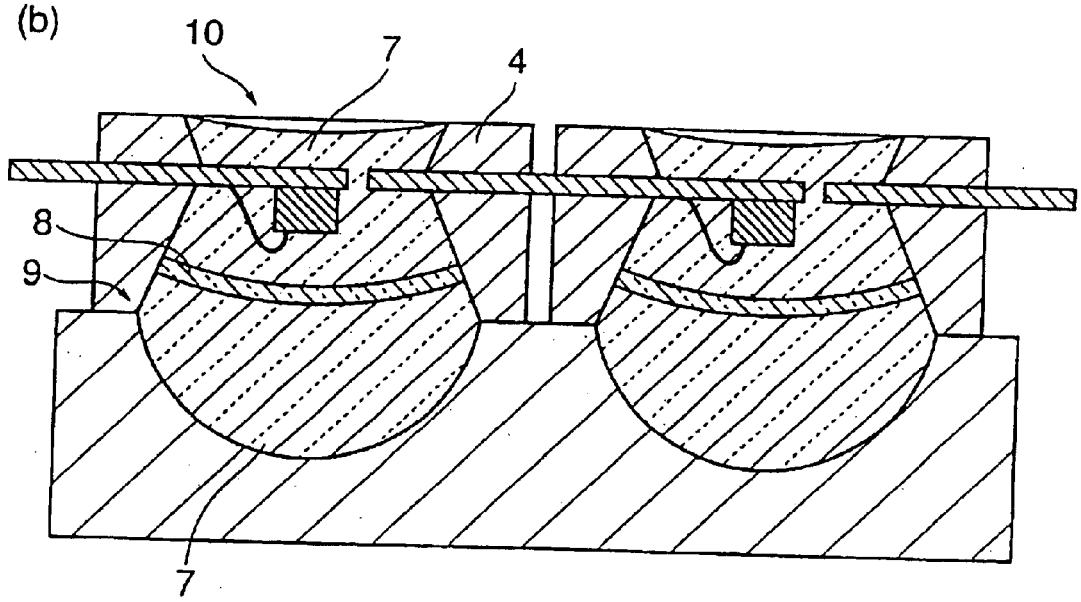

A chip-type LED according to Embodiment 2 of the present invention is explained with reference to FIGS. 5 to 8. FIG. 5 is a plan view of the chip-type LED according to Embodiment 2 of the present invention, FIG. 6 is a front view of the same, FIG. 7 is a section taken along the line B—B shown in FIG. 5. FIGS. 8(a) and 8(b) are views illustrating the steps of manufacturing the chip-type LED according to Embodiment 2 of the present invention.

In the chip-type LED according to Embodiment 2, components same as those in the chip-type LED according to Embodiment 1 are given with the same reference numerals.

As shown in FIGS. 5 to 7, the chip-type LED 201 according to Embodiment 2 of the present invention includes a light-transmissive resin 7 formed to have a convex lens portion at an upper opening 9. Other components are arranged in the same manner as in the chip-type LED 101 according to Embodiment 1.

The step of forming the fluorescent layer 8 and the step of filling the light-transmissive resin 7 are explained with reference to FIGS. 8(a) and 8(b).

As shown in FIG. 8(a), the vessel 4 integrated with the first and second lead frames 3a and 3b, the LED element 1 and the gold wire 2 is closely adhered to a mold 14 having a concave portion 13 corresponding to the shape of the convex lens portion such that the upper opening 9 of the vessel 4 is closed by the concave portion 13 of the mold 14.

Then, as shown in FIG. 8(b), a predetermined amount of the light-transmissive resin 7 is added dropwise into the vessel 4 closed by the concave portion 13 through the lower opening 10. After the thus added light-transmissive resin 7 is cured spontaneously, a predetermined amount of a light-transmissive resin containing a fluorescent material is added dropwise. After the light-transmissive resin containing the fluorescent material is cured into the fluorescent layer 8, the light-transmissive resin 7 is added through the lower opening 10 to fill the vessel 4 completely.

The mold 14 is removed after the light-transmissive resin 7 is cured spontaneously, thereby the chip-type LED 201 shown in FIGS. 5 to 7 is completed.

According to the steps, the light-transmissive resin 7 is formed to have the convex lens portion at the upper opening 9 and the fluorescent layer 8 having a uniform thickness is formed only in the neighborhood of the upper opening 9.

Embodiment 3

Figure 9:
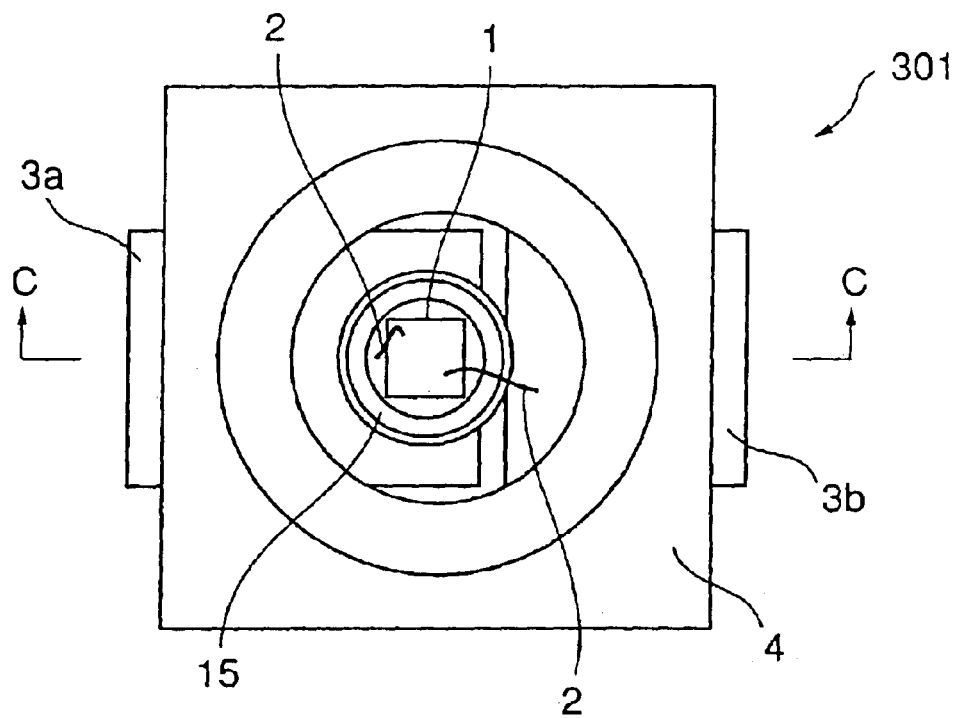
FIG. 9 is a plan view of a chip-type LED according to Embodiment 3 of the present invention.
Figure 10:
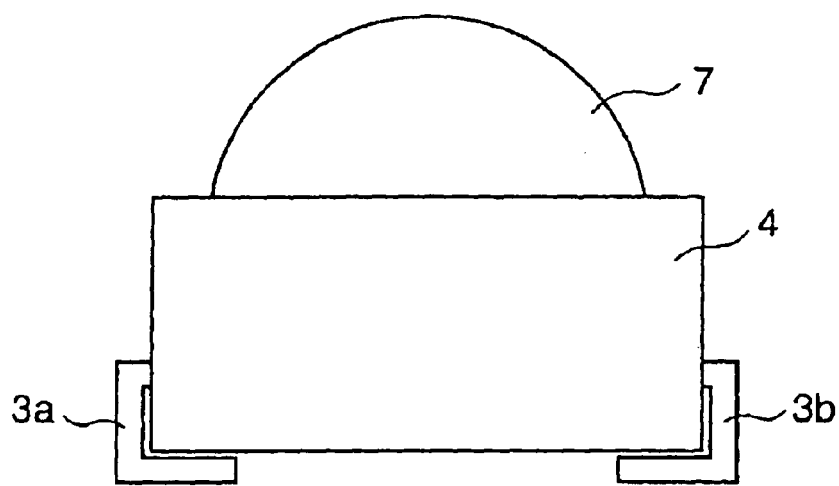
FIG. 10 is a front view of the chip-type LED shown in FIG. 9.
Figure 11:
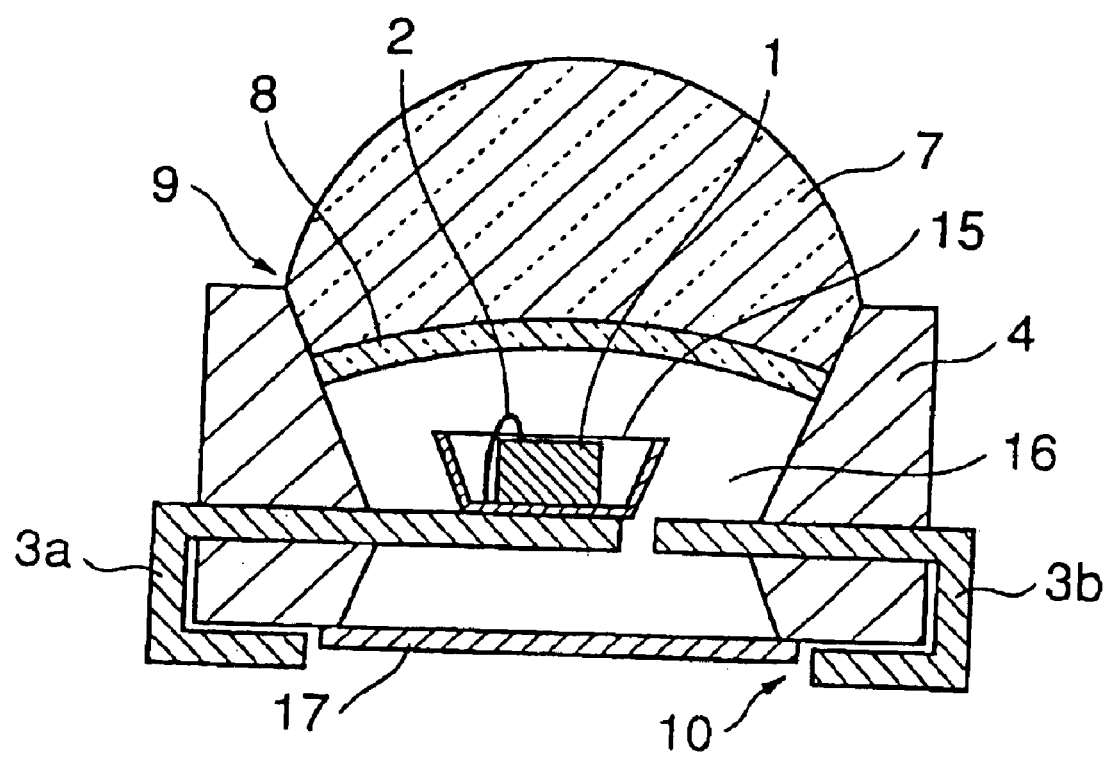
FIG. 11 is a section of the chip-type LED shown in FIG. 9 taken along the line C—C.

A chip-type LED according to Embodiment 3 of the present invention is explained with reference to FIGS. 9 to 11. FIG. 9 is a plan view of the chip-type LED according to Embodiment 3 of the present invention, FIG. 10 is a front view of the same, FIG. 11 is a section taken along the line C—C shown in FIG. 9. In the chip-type LED according to Embodiment 3, components same as those in the chip-type LEDs according to Embodiments 1 and 2 are given with the same reference numerals.

As shown in FIGS. 9 to 11, the chip-type LED 301 according to Embodiment 3 of the present invention comprises a LED element 1 for emitting bluish-purple light, a pot-shaped cup 15 for accommodating the LED element 1 therein, a tubular vessel 4 having an upper opening 9 and a lower opening 10 and accommodating the cup 15 therein, a light-transmissive resin (member) 7 for sealing the upper opening 9 of the vessel 4, a fluorescent layer 8 for converting the bluish-purple light to yellow light, and a first lead frame 3a and a second frame 3b inserted across the vessel 4. The first lead frame 3a and the second lead frame 3b are electrically connected to the LED element 1, the cup 15 is placed on the first lead frame 3a such that the light emitted from the LED element 1 is reflected in the cup 15 towards the upper opening 9, the fluorescent layer 8 is positioned between the LED element 1 and the light-transmissive resin 7.

In detail, as shown in FIGS. 9 to 11, the light-transmissive resin 7 is formed to have a convex lens portion at the upper opening 9 and the fluorescent layer 8 of a uniform thickness for converting the bluish-purple light to yellow light is formed only in the neighborhood of the upper opening 9.

On the first lead frame 3a, the pot-shaped cup 15 made of metal is mounted such that the bluish-purple light emitted from the LED element 1 surely enter the fluorescent layer 8. The LED element 1 is placed in the cup 15 and electrically connected with the first and second lead frames 3a and 3b via a gold wire 2.

The cup 15 may be formed in one-piece with or independently from the first lead frame 3a.

In a space between the fluorescent layer 8 and the lower opening 10, the light-transmissive resin 7 is not filled, thereby leaving a hollow portion 16. The hollow portion 16 is filled with nitrogen and then a sealing plate 17 is adhered onto the lower opening 10. Other components are arranged in the same manner as in the chip-type LED according to Embodiment 1.

The step of filling the light-transmissive resin 7 and the step of forming the fluorescent layer 8 are fundamentally the same as those mentioned in Embodiment 2, except that the hollow portion 16 is filled with nitrogen after the fluorescent layer 8 is formed and then the lower opening 10 is closed by the sealing plate 17.

Embodiment 4

Figure 12:
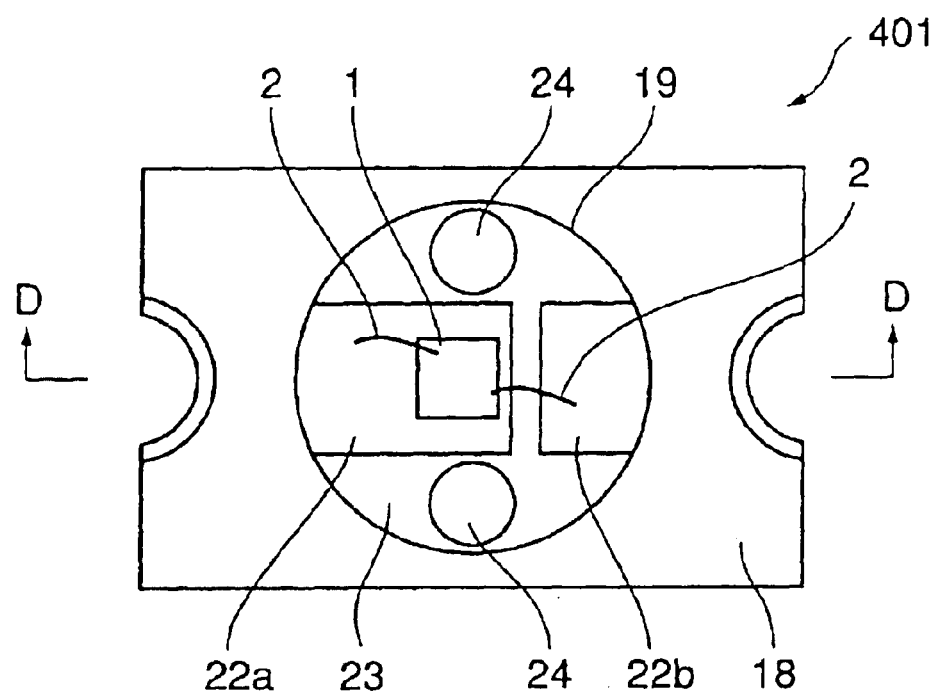
FIG. 12 is a plan view of a chip-type LED according to Embodiment 4 of the present invention.

A chip-type LED according to Embodiment 4 of the present invention is explained with reference to FIGS. 12 and 13. FIG. 12 is a plan view of the chip-type LED according to Embodiment 4 of the present invention and FIG. 13 is a section taken along the line D—D shown in FIG. 12.

In the chip-type LED according to Embodiment 4, components same as those in the chip-type LEDs according to Embodiments 1 to 2 are given with the same reference numerals.

Figure 13:
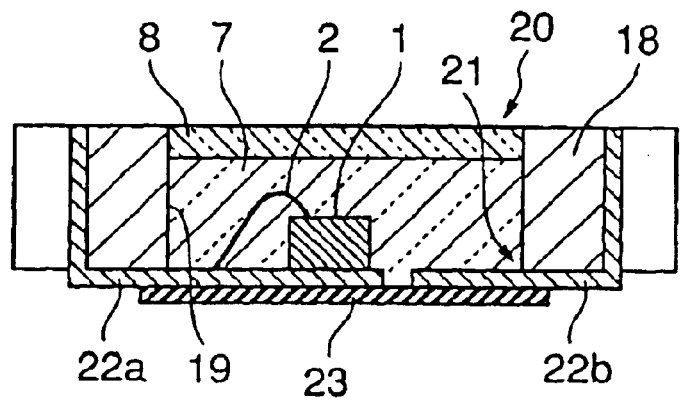
FIG. 13 is a section of the chip-type LED shown in FIG. 12 taken along the line D—D.

As shown in FIGS. 12 and 13, the chip-type LED 401 according to Embodiment 4 of the present invention comprises a plate-shaped insulating substrate 18 having a bore 19 penetrating from a front surface to a rear surface thereof, the bore having a front opening 20 and a rear opening 21, a pair of first and second wiring traces 22a and 22b formed on the rear surface and partially extended into the rear opening 21, a LED element 1 mounted on the first wiring trace 22a in the bore 19 and electrically connected with the first and second wiring traces 22a and 22b, an insulating film 23 formed on the rear surface to cover the first and second wiring traces 22a and 22b and the rear opening 21, and a light-transmissive resin (member) 7 formed in the bore 19 to cover the LED element 1. The insulating film 23 has a hole 24 leading into the bore 19 for adding dropwise a material of the light-transmissive resin 7 into the bore 19 through the hole 24.

In detail, as shown in FIGS. 12 and 13, the LED element 1 which emits blue light is mounted on a portion of the first wiring trace 22a extending into the rear opening 21. The LED element 1 is electrically connected with the first and second wiring traces 22a and 22b by bonding them via a gold wire 2.

In the neighborhood of the front opening 20 of the bore 19, the fluorescent layer 8 of a uniform thickness for converting the blue light to yellow light is formed, and the light-transmissive resin 7 which is a transparent epoxy resin is filled in a space between the fluorescent layer 8 and the rear opening 21.

The step of forming the fluorescent layer 8 and the step of filling the light-transmissive resin 7 are fundamentally the same as those according to Embodiment 1, except that the resin 7 is added dropwise and filled through the hole 24 of the insulating film 23.

According to the steps, manufactured is the chip-type LED 401 of the substrate type including the fluorescent layer 8 of a uniform thickness formed only in the neighborhood of the front opening 20 of the insulating substrate 18.

Embodiment 5

Figure 14:
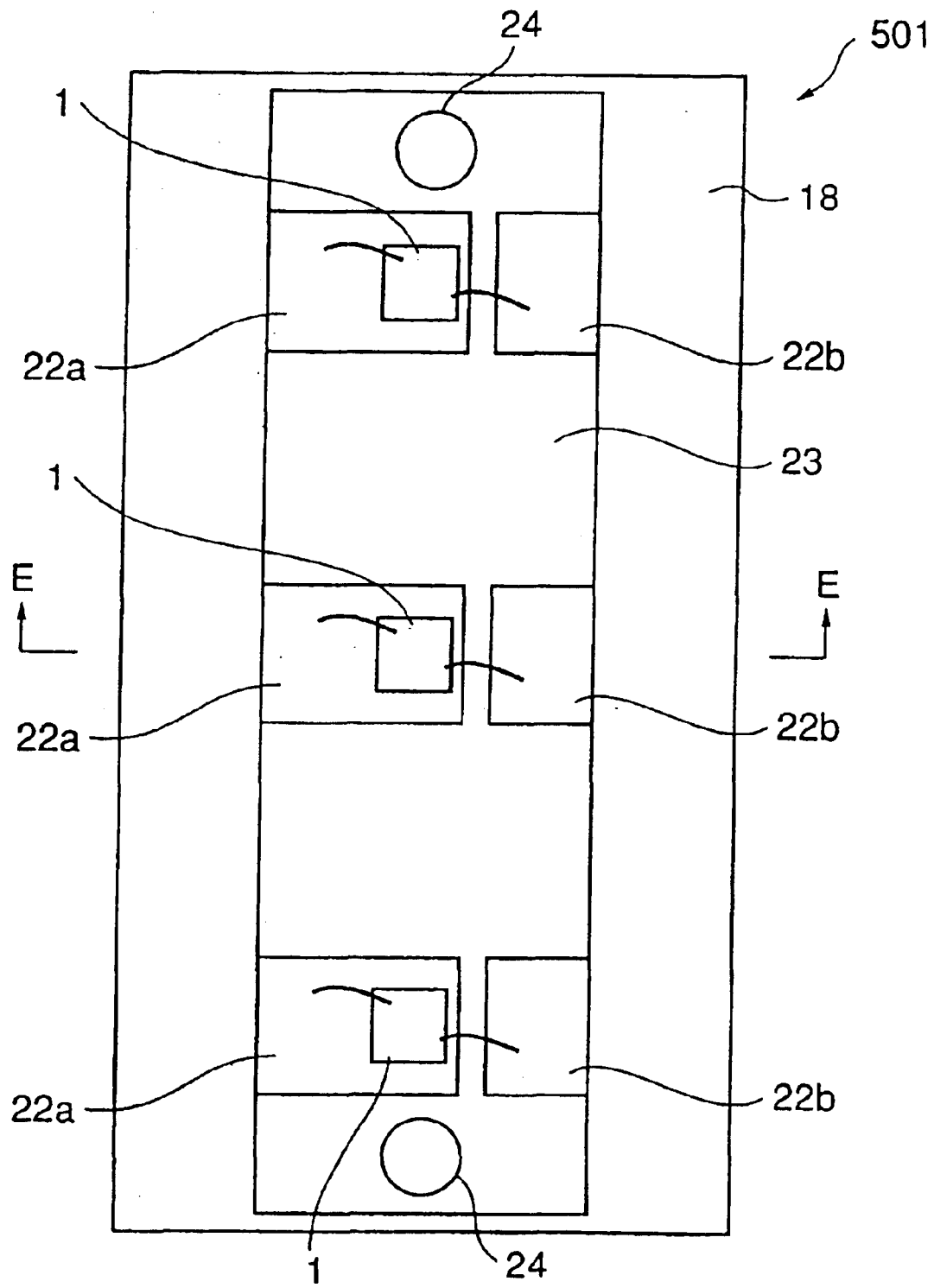
FIG. 14 is a plan view of a chip-type LED according to Embodiment 5 of the present invention.
Figure 15:
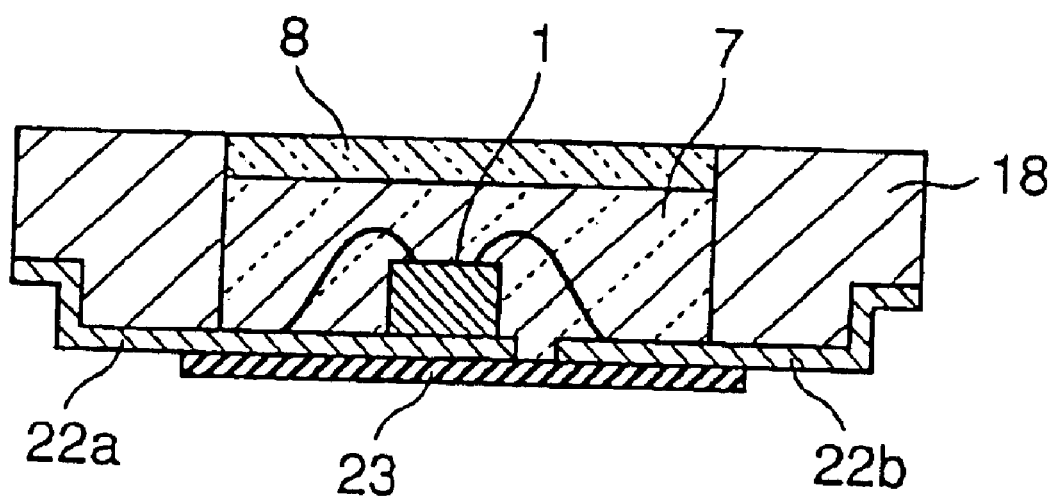
FIG. 15 is a section of the chip-type LED shown in FIG. 14 taken along the line E—E.

A chip-type LED according to Embodiment 5 of the present invention is explained with reference to FIGS. 14 and 15. FIG. 14 is a plan view of the chip-type LED according to Embodiment 5 of the present invention and FIG. 15 is a section taken along the line E—E shown in FIG. 14. In the chip-type LED according to Embodiment 5, components same as those in the chip-type LEDs according to Embodiments 1 to 4 are given with the same reference numerals.

As shown in FIGS. 14 and 15, the chip-type LED 501 according to Embodiment 5 of the present invention comprises plural pairs of first and second wiring traces 22a and 22b formed on an insulating substrate 18 and LED elements 1 mounted on the first wiring traces 22a, respectively.

On both ends of an insulating film 23, holes 24 for injecting a light-transmissive resin are provided, respectively. Other components are arranged in the same manner as in the chip-type LED 401 according to Embodiment 4. The step of forming fluorescent layer 8 and the step of filling the light-transmissive resin 7 are also the same as those according to Embodiment 4.

Embodiment 6

Figure 16:
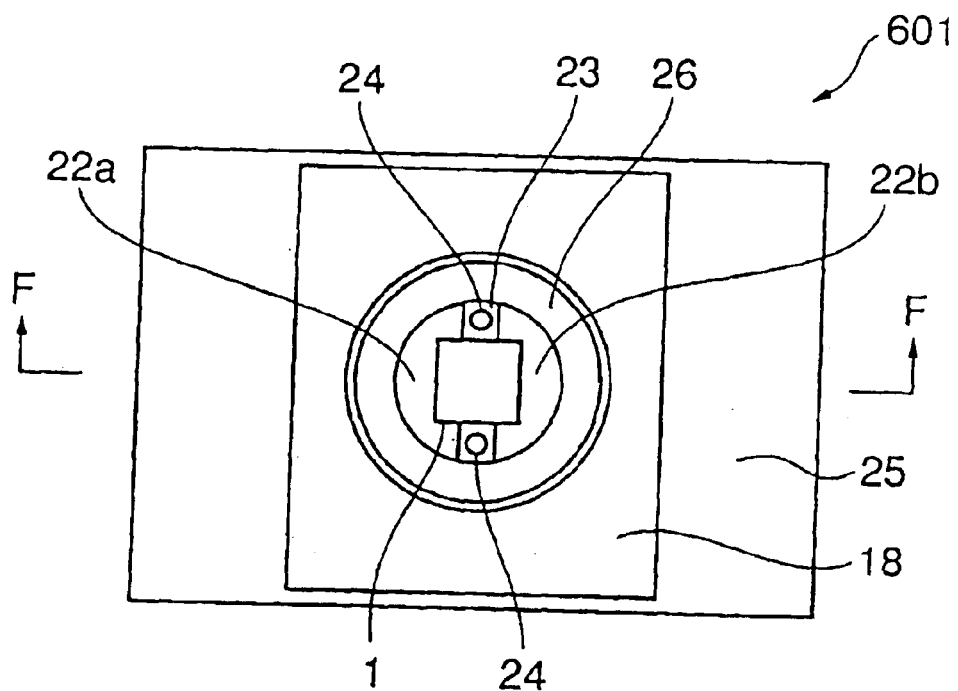
FIG. 16 is a plan view of a chip-type LED according to Embodiment 6 of the present invention.
Figure 17:
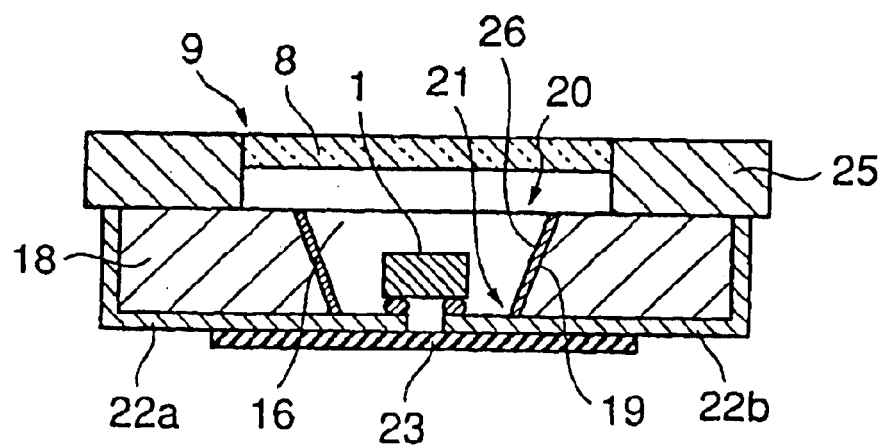
FIG. 17 is a section of the chip-type LED shown in FIG. 16 taken along the line F—F.

A chip-type LED according to Embodiment 6 of the present invention is explained with reference to FIGS. 16 and 17. FIG. 16 is a plan view of the chip-type LED according to Embodiment 6 of the present invention and FIG. 17 is a section taken along the line F—F shown in FIG. 16. In the chip-type LED according to Embodiment 6, components same as those in the chip-type LEDs according to Embodiments 1 to 5 are given with the same reference numerals.

As shown in FIGS. 16 and 17, the chip-type LED 601 according to Embodiment 6 of the present invention comprises a first wiring trace 22a and a second wiring trace 22b each extending into a rear opening 21 of a bore 19.

A LED element 1 has a pair of electrodes (not shown), which are mounted via flip-chip bonding on the first and second wiring traces 22a and 22b extending into the rear opening 21, respectively, thereby the LED element 1 is electrically connected with the first and second wiring traces 22a and 22b. The LED element 1 emits bluish-purple light.

On a front surface of the insulating substrate 18 a frame member 25 is provided and a fluorescent layer 8 of a uniform thickness for converting the bluish-purple light to yellow light is provided only in the neighborhood of an upper opening 9 of the frame member 25. The bore 19 is configured such that an inner diameter thereof gradually increases from the rear opening 21 towards the front opening 20.

On an inner wall surface of the bore 19, a reflective layer 26 made of metal is formed such that the bluish-purple light emitted from the LED element 1 surely enter the fluorescent layer 8. A space between the fluorescent layer 8 and the rear opening 21 is a hollow portion 16 in which the light-transmissive resin is not filled. The hollow portion 16 is filled with nitrogen and the hole 24 of the insulating film 23 is closed by a sealing plate (not shown). Other components are arranged in the same manner as in the chip-type LED 401 according to Embodiment 4.

The florescent layer 8 is formed fundamentally in the same manner as in Embodiment 1, except that the resin is added dropwise through the hole 24 of the insulating film 23 and that the hollow portion 16 is filled with nitrogen and the hole 24 is closed by the sealing plate after the fluorescent layer 8 is formed.

Though it is not shown in the figures, it may be possible to form plural pairs of the first and second wiring traces 22a and 22b on the insulating substrate 18 as done in Embodiment 5 and then the LED element 1 is mounted on each of the first wiring traces 22a. If the hole 24 for the resin injection of a greater size is required, the hole 24 may be formed to penetrate both of the insulating film 23 and the insulating substrate 18.

Embodiment 7

Figure 18:
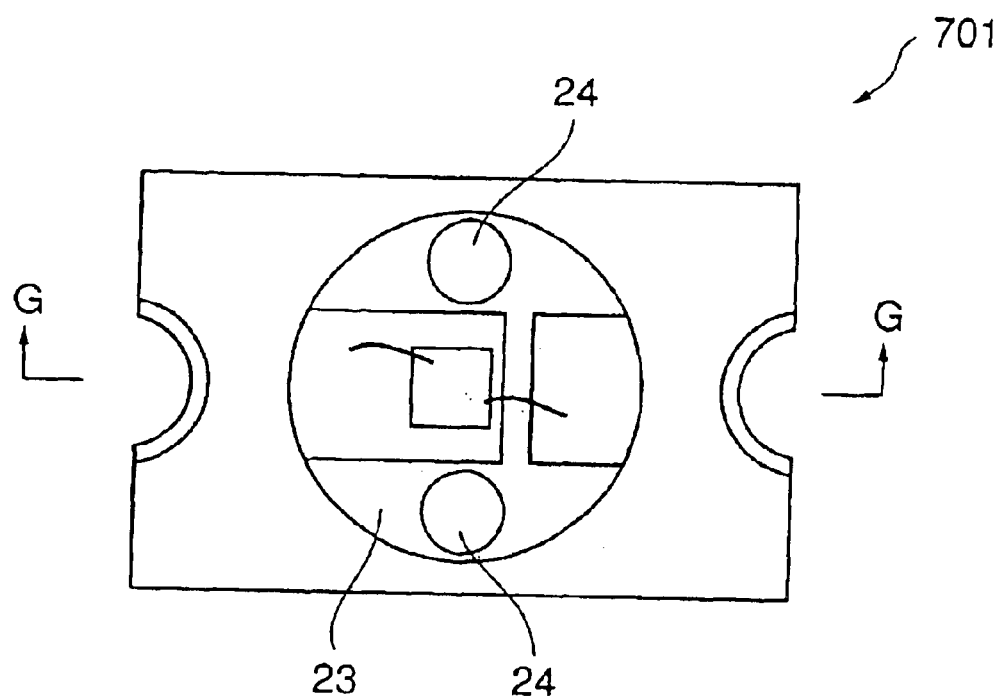
FIG. 18 is a plan view of a chip-type LED according to Embodiment 7 of the present invention.
Figure 19:
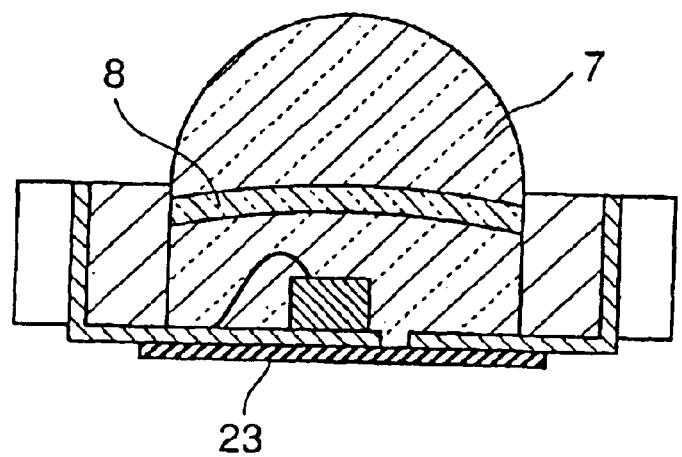
FIG. 19 is a section of the chip-type LED shown in FIG. 12 taken along the line G—G.

A chip-type LED according to Embodiment 7 of the present invention is explained with reference to FIGS. 18 and 19. FIG. 18 is a plan view of the chip-type LED according to Embodiment 7 of the present invention and FIG. 19 is a section taken along the line G—G shown in FIG. 18. In the chip-type LED according to Embodiment 7, components same as those in the chip-type LEDs according to Embodiments 1 to 6 are given with the same reference numerals.

As shown in FIGS. 18 and 19, the chip-type LED 701 according to Embodiment 7 of the present invention comprises a light-transmissive resin 7 having a convex lens portion protruding from a front surface of the substrate. Other components are arranged in the same manner as in the chip-type LED 401 according to Embodiment 4.

The step of filling the light-transmissive resin 7 and the step of forming the fluorescent layer 8 are fundamentally the same as those according to Embodiment 2, expect that the resin is filled by adding dropwise through the hole 24 of the insulating film 23.

According to the present invention, the LED element is positioned between the upper opening and the lower opening of the tubular vessel and the light-transmissive resin fills the vessel from the upper opening to the lower opening. Thus, a chip-type LED which is highly resistant to an externally applied thermal stress is provided.

What is claimed is:

1. A process of manufacturing a chip-type LED comprising the steps of:

accommodating a LED element in a tubular vessel;

closely adhering the vessel to an adhesive tape to seal an upper opening of the vessel with the adhesive tape;

adding dropwise a light-transmissive resin through a lower opening of the vessel; and peeling off the adhesive tape from the vessel.

2. A process of manufacturing a chip-type LED according to claim 1, wherein the vessel has an inner wall extending from the upper opening to the lowing opening through an intermediate position, the LED element is positioned at the intermediate position such that the LED element emits light toward the upper opening, and the inner wall has a first diminishing conical taper from the upper opening to the intermediate position and a second diminishing conical taper from the lower opening to the intermediate position.

3. A process of manufacturing a chip-type LED according to claim 1, wherein the step of adding dropwise the light-transmissive resin includes a step of adding dropwise the light-transmissive resin through the lower opening of the vessel such that the vessel is filled with the light-transmissive resin from the upper opening to the lower opening.

4. A process of manufacturing a chip-type LED comprising the steps of:

inserting a first lead frame and a second lead frame into a tubular vessel;

mounting a LED element on the first lead frame, to electrically connect the LED element to the first and second lead frames;

closely adhering the vessel to an adhesive tape to seal an upper opening of the vessel with the adhesive tape;

adding dropwise a light-transmissive resin containing a fluorescent material through a lower opening of the vessel to form a fluorescent layer in a neighborhood of the upper opening, adding dropwise a light-transmissive resin through the lower opening of the vessel; and peeling off the adhesive tape from the vessel.

5. A process of manufacturing a chip-type LED comprising the steps of:

inserting a first lead frame and a second lead frame into a tubular vessel;

placing a pot-shaped cup on the first lead frame, accommodating a LED element for emitting bluish-purple light in the cup to electrically connect the LED element to the first and second lead frames;

closely adhering the vessel to an adhesive tape to seal an upper opening of the vessel with the adhesive tape;

adding dropwise a light-transmissive resin containing a fluorescent material through a lower opening of the vessel to form the fluorescent layer in a neighborhood of the upper opening; and peeling off the adhesive tape from the vessel.

6. A process of manufacturing a chip-type LED comprising the steps of:

forming a first wiring trace and a second wiring trace on a rear surface of an insulating substrate having a bore penetrating from a front surface to the rear surface so that the first and second wiring traces are partially extend into a rear opening of the bore;

mounting a LED element on the first wiring trace to electrically connect the LED element to the first and second wiring traces;

forming an insulating film having a hole leading into the bore to cover the first and second wiring traces and the rear opening;

closely adhering the insulating substrate to an adhesive tape to seal a front opening of the bore with the adhesive tape;

adding dropwise a light-transmissive resin through the hole of the insulating film to form a light-transmissive member covering the LED element; and peeling off the adhesive tape from the insulating substrate.

* * * * *